(12) United States Patent
Ramsour et al.

(10) Patent No.: US 8,028,265 B2
(45) Date of Patent: Sep. 27, 2011

(54) SYSTEM AND METHOD FOR IMPROVED PLACEMENT IN CUSTOM VLSI CIRCUIT DESIGN WITH SCHEMATIC-DRIVEN PLACEMENT

(75) Inventors: William D. Ramsour, Pflugerville, TX (US); Samuel I. Ward, Austin, TX (US); Jun Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 499 days.

(21) Appl. No.: 12/183,898

(22) Filed: Jul. 31, 2008

(65) Prior Publication Data

US 2010/0031215 A1 Feb. 4, 2010

(51) Int. Cl.
*G06F 17/50* (2006.01)
*G06F 15/04* (2006.01)

(52) U.S. Cl. ......... 716/122; 716/118; 716/119; 716/139

(58) Field of Classification Search .......... 716/118–119, 716/139, 122
See application file for complete search history.

(56) References Cited

U.S. PATENT DOCUMENTS

| | | | |
|---|---|---|---|
| 5,493,510 A | 2/1996 | Shikata | |
| 5,619,419 A | 4/1997 | D'Haeseleer et al. | |
| 5,696,693 A | 12/1997 | Aubel et al. | |
| 5,768,479 A | 6/1998 | Gadelkarim et al. | |
| 5,838,583 A * | 11/1998 | Varadarajan et al. | 716/123 |
| 5,872,952 A | 2/1999 | Tuan et al. | |
| 6,496,715 B1 | 12/2002 | Lee et al. | |
| 6,792,583 B1 | 9/2004 | Takahashi et al. | |
| 7,082,595 B1 * | 7/2006 | Chan et al. | 716/119 |
| 7,269,815 B2 | 9/2007 | Wein et al. | |
| 2005/0028113 A1 | 2/2005 | Lin et al. | |
| 2005/0172252 A1 | 8/2005 | Cheng et al. | |
| 2010/0031218 A1 * | 2/2010 | Ramsour et al. | 716/10 |

OTHER PUBLICATIONS

Artz, D. et al; "A solution to mapping an ASIC design hierarchy into an efficient block-place-and-route layout hierarchy;" ASIC Seminar and Exhibit, 1990. Proceedings., Third Annual IEEE; Sep. 17-21, 1990 pp. P6/2.1-P6/2.3.

Tan, X. et al.; "An efficient multi-way algorithm for balanced partitioning of VLSI circuits;" Proceedings. 1997 IEEE International Conference on Computer Design: VLSI in Computers and Processors, 1997. ICCD '97. Oct. 12-15, 1997 pp. 608.

* cited by examiner

*Primary Examiner* — Stacy Whitmore
(74) *Attorney, Agent, or Firm* — Patrick E. Caldwell, Esq.; The Caldwell Firm, LLC

(57) ABSTRACT

A method for generating an electronic circuit layout with placed circuit elements receives a user provided schematic, the user provided schematic comprising a plurality of circuit elements, each circuit element comprising general parameters. The method associates a plurality of first placement parameters with each of the plurality of circuit elements, wherein the first placement parameters comprise a cell horizontal position, a cell vertical stacking position, and a cell vertical adjacent spacing. The method retrieves, from a design library, design parameters associated with at least one of the plurality of circuit elements. The method assigns first absolute placement coordinates for each of the plurality of circuit elements based on the first placement parameters and the design parameters. The method defines and performs an adjustment operation on the placement parameters of a selected subset of circuit elements, generating adjusted placement parameters. The method assigns second absolute placement coordinates based on the first placement parameters, the design parameters, and the adjusted placement parameters and generates an electronic circuit layout with placed circuit elements based on the second absolute placement coordinates.

25 Claims, 4 Drawing Sheets

US 8,028,265 B2

SYSTEM AND METHOD FOR IMPROVED PLACEMENT IN CUSTOM VLSI CIRCUIT DESIGN WITH SCHEMATIC-DRIVEN PLACEMENT

TECHNICAL FIELD

The present invention relates generally to the field of electronic circuit design, computer aided design (CAD) and, more particularly, to a system and method for improved placement in custom VLSI circuit design with schematic-driven placement.

BACKGROUND OF THE INVENTION

Modern electronic systems frequently include complex electronic circuits. Some complex electronic circuits, especially very large scale integration (VSLI) integrated circuits, require CAD tools to design. Generally, in custom VLSI circuit design, the design engineer orchestrates the specific circuit placement in the layout after completing the overall schematic. That is, the functional design implementation (the schematic) precedes the placed circuit layout.

Many engineers use graphical tools or a unique placement routine for each design. In common graphical approaches, it usually takes the design engineer some effort to make the placement ground rule correct. Moreover, if there is any change in either the device size or topology in the schematic, the engineer must manually modify the placement in the layout. In graphical approaches, the design engineer estimates the area, size, and form factor of the design based on the floor plan, total device width in the schematic, and projected wiring tracks required to route the design.

In non-graphical approaches, some systems allow a placement routine implemented in a specialized programming language, such as SKILL. Common SKILL code driven placement requires customized functions and hard-coded instance names, which requires distinct coding efforts for each placed sub-circuit. Accordingly, typical SKILL code approaches offer only limited scalability and extensibility. Most SKILL code approaches therefore suffer from the same drawback as typical graphical approaches, namely, re-placing circuit elements based on engineering changes is difficult and cumbersome.

Therefore, there is a need for a system and/or method for improved placement in custom VLSI circuit design that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A method for generating an electronic circuit layout with placed circuit elements receives a user provided schematic, the user provided schematic comprising a plurality of circuit elements, each circuit element comprising general parameters. The method associates a plurality of first placement parameters with each of the plurality of circuit elements, wherein the first placement parameters comprise a cell horizontal position, a cell vertical stacking position, and a cell vertical adjacent spacing. The method retrieves, from a design library, design parameters associated with at least one of the plurality of circuit elements, wherein the design parameters comprise an element size, a polysilicon gate pitch, and a bit width. The method assigns first absolute placement coordinates for each of the plurality of circuit elements based on the first placement parameters and the design parameters. The method defines and performs an adjustment operation on the placement parameters of a selected subset of circuit elements, generating adjusted placement parameters. The method assigns second absolute placement coordinates based on the first placement parameters, the design parameters, and the adjusted placement parameters and generates an electronic circuit layout with placed circuit elements based on the second absolute placement coordinates.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
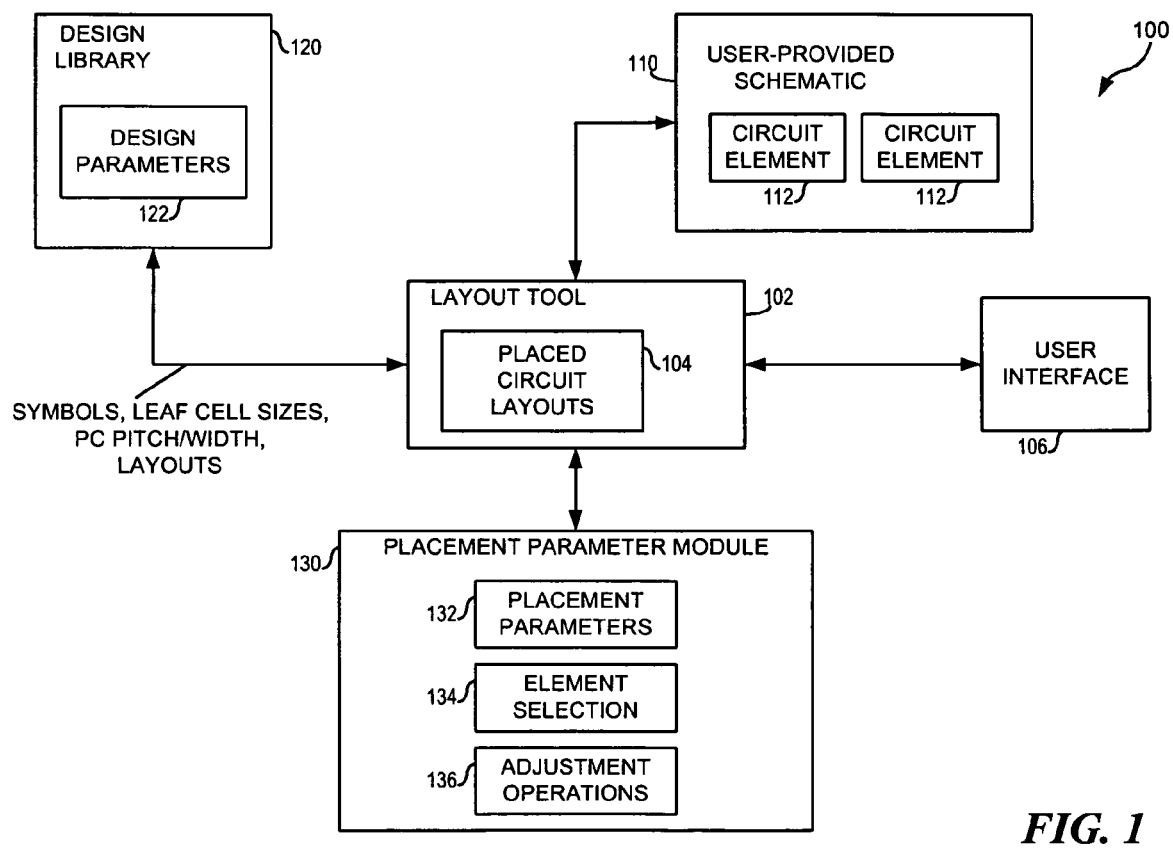
FIG. 1 illustrates a block diagram showing a custom circuit design system in accordance with a preferred embodiment.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Referring now to the drawings, FIG. 1 illustrates a custom circuit design system 100 in accordance with a preferred embodiment. System 100 includes a layout tool 102. In one embodiment, layout tool 102 is a software tool configured to operate with a common CAD program and/or suite. In one embodiment, system 100 is configured to operate with the Cadence™ CAD suite. Layout tool 102 includes one or more placed circuit layouts 104. In the illustrated embodiment, placed circuit layouts 104 is a storage area for user-defined placed circuit layouts. Generally, as used herein, a "placed circuit layout" is a circuit layout in which the circuit elements have been arranged in the positions they are to occupy on a physical chip. Layout tool 102 couples to an otherwise conventional user interface 106.

In one embodiment, layout tool 102 is configured to receive user-provided schematics. In the illustrated embodiment, layout tool 102 receives user-provided schematic 110. As illustrated, user-provided schematic 110 is an otherwise conventional electronic circuit schematic and includes a plurality of circuit elements 112. Generally, as used herein, a "user-provided schematic" is a representation of an electronic circuit that includes one or more circuit elements and information indicating how the included circuit elements couple together. Generally, as used herein, a "circuit element" is an electronic circuit, logic gate, macro, sub-circuit, or other suitable device or collection of devices.

In one embodiment, layout tool 102 receives a user-provided schematic and applies design parameters retrieved from a design library to each circuit element in the schematic. In the illustrated embodiment, layout tool 102 retrieves design parameters from design library 120. Design library 120 is an otherwise conventional design library and includes a plurality of design parameters 112.

Generally, each circuit element has design parameters associated with that particular circuit element, for that particular technology. For example, in one embodiment, design parameters include an element size, a polysilicon gate pitch, and a bit width. In one embodiment, design parameters can be embodied as symbols, leaf cell sizes, polysilicon gate channel (PC) pitches/widths, and layouts. One skilled in the art will understand that design library 120 can also be configured to use other design parameters and embodiments.

In the illustrated embodiment, layout tool 102 retrieves design parameters from a design library and applies the appropriate design parameters to the circuit elements in the user-provided schematic. In the illustrated embodiment, layout tool 102 also retrieves placement parameters from a placement parameter module and applies the placement parameters to the circuit elements in the user-provided schematic.

In particular, system 100 includes placement parameters module 130. In the illustrated embodiment, placement parameters module 130 includes placement parameters 132, element selection module 134, and adjustment operation module 136. Generally, each circuit element includes one or more placement parameters associated with that circuit element, which help fix the absolute and relative placement of that circuit element. Placement parameters 132 stores placement parameters, described in more detail below, which include the "fipBit", "fipYlevel", and "fippcskip" parameters, among others.

Generally, element selection module 134, described in more detail below, selects one or more circuit elements of the user-provided schematic. Generally, adjustment operation module 136, also described in more detail below, performs an adjustment operation on certain placement parameters of the selected circuit elements.

As described above, system 100 is a custom circuit design system. Thus, generally, system 100 operates to encode shorthand relative placement information within a schematic. In one embodiment, the system assigns five special "placement parameters" to the schematic instance symbols, which describe the placement of the instances. In one embodiment, these five placement parameters include a definition of a circuit element (or "cell") physical position in the horizontal direction on a chip, a definition of the cell's vertical stacking level relative to other cells in the vertical direction, a definition of the cell orientation, a specification of vertical alignment of multiple cell instances, and a definition of vertical spacing between two adjacent cell instances. Thus, in one embodiment, the five parameters can describe any placement topology desired by the user, by representing a relative placement of each cell.

With the placement parameters associated with the circuit elements, a generalized code routine interprets and processes the placement parameters to generate a placed layout view. Because the placement parameters are structured and defined regularly across all designs, a design engineer can re-use the same generalized code routine for every circuit element placed.

The following definitions will facilitate an understanding of the invention described herein. As used herein, a "VLSI Circuit Hierarchy" can comprise various levels of functional circuit units. As an example, a VLSI circuit can comprise a plurality of "units," such as a floating point unit or an instruction fetch unit, for example. Each unit can comprise one or more "macros," such as a 32-bit parallel adder or a 32-bit register, for example. A macro can comprise one or more "sub-macros," such as a clock drive, latch, or 4-bit ripple carry adder, for example. A sub-macro can comprise one or more "gates" or "cells," such as a 2 input NAND or a 3 input NOR, for example. A gate/cell can comprise one or more transistors/devices.

As used herein, unless otherwise stated, a "library" is a design database that contains the symbol, schematic, and layout of all the macros, sub-macros and leaf cells/gates used in a design. As used herein, a "floor plan" is a graphical drawing that indicates the location, size and form factor of certain level of a VLSI circuit hierarchy. Generally, a floor plan is a precursor to a layout.

As used herein, a "circuit layout" is a graphical drawing that indicates the location, size and form factors of objects. In one embodiment, the detailed shapes of the objects represent different manufacturing layers of the semi-conductor process, such as, for example, polygate channel, metal layers for interconnecting objects, P+ diffusion area of a transistor, N+ diffusion area of a transistor, etc. A foundry uses a completely placed, routed, and checked circuit layout to manufacture the VLSI circuit/chip.

As used herein, a "placed layout" is a graphical drawing that indicates the locations of any sub-macros/gates/cells. A placed layout is similar to a circuit layout, except that the placed layout does not contain any interconnections or routing between sub-macros/gates/cells.

As used herein, "ground rules" are the spacing and width design specification for shapes in the layout, which define the geometry of different layers of a semi-conductor process. As used herein, a "prBoundary" is a shape in a layout that outlines the perimeter of the layout. In one embodiment, every shape inside the prBoundary is aligned half a design ground rule from the edge of the prBoundary shape such that, when instances of different layouts abut, the layout instances are all ground rule correct.

As described above, in one embodiment, system 100 includes five placement parameters. In one embodiment, the five placement parameters are "fipBit," "fipYlevel," "fipRot," "fipSnap," and "fipPcskip." Generally, in one embodiment, fipBit defines a physical horizontal position, fipylevel defines a relative stacking level, fipRot defines a cell orientation, fipSnap defines a vertical alignment of multiple instances, and fipPcskip defines a vertical spacing between two adjacent instances. They are illustrated and defined as follows:

In a particular embodiment, fipBit defines a cell horizontal position, the physical horizontal position in the layout. Each physical position is x micrometers (um) wide and corresponds to the standard width of the cell library for the technology in use. In one embodiment, system 100 stores the value of x as a design parameter In general the horizontal placement coordinates of an instance of a circuit element is x um multiplied by the fipBit value of the instance.

In a particular embodiment, fipylevel defines a cell vertical stacking level, the relative vertical stacking level of an instance. For example, system 100 places the instance with the lowest value for fipylevel at the lower origin of the layout grid (which, in one embodiment, is the x-axis). Each instance with a higher fipylevel stacks "on top of" this instance, that is, in the y-axis direction, in order of lowest to highest relative vertical stacking level. In one embodiment, the prBoundaries of these instances abut by default, which improves compacting efficiency.

In a particular embodiment, fipRot defines the orientation of the cell. In one embodiment, fipRot controls any rotation or mirroring of the cell to be placed. Generally, in one embodiment, system 100 can modify fipRot to help optimize routing.

Figure 2:
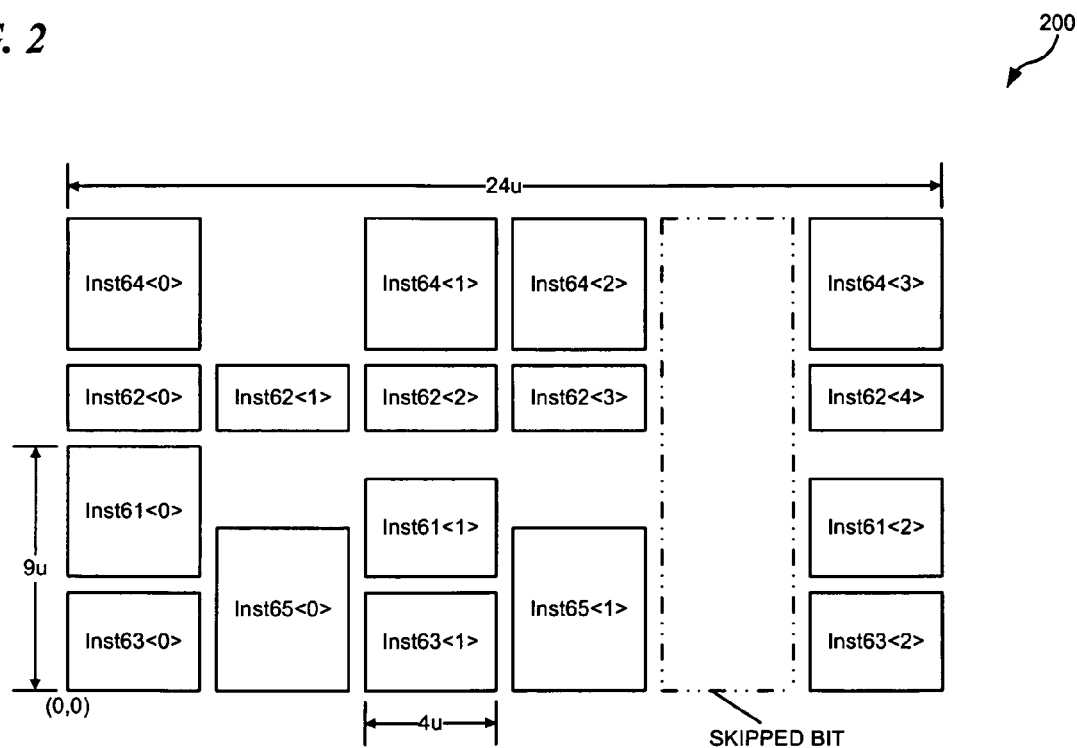
FIG. 2 illustrates a block diagram showing an example circuit element placement in accordance with a preferred embodiment.

In a particular embodiment, fipSnap allows the user to align multiple instances on a horizontal plumb line. For example, certain dataflow macros comprising an array of multiplexors or registers typically need to be aligned along the same horizontal line, that is, the array elements "snap" to the same "elevation," or vertical distance from the x-axis. In one embodiment, all instances with fipSnap enabled will have a y-axis location equal to the highest snap line beneath it. A particular example, described below in conjunction with FIG. 2, illustrates this operation.

In a particular embodiment, fipPcskip defines a cell vertical adjacent spacing, that is, a padding of a number of PC pitches before an instance begins at its fipylevel stacking position. That is, system 100 places a circuit element with a fipPcskip of "2", two PC pitches above the circuit element's vertical position indicated by the fipylevel parameter.

In many custom VLSI circuit designs, the placements of an array of circuit element instances occur in a recurring pattern. In one embodiment, "instance parameter" notation substitutes an encoded description of arrayed instances, such that a bank of cells need not be individually described. For example, in one embodiment, an ellipsis (" . . . ") appended to a fipBit, fipylevel, or fipSnap parameter indicates to system 100 that the layout tool should extrapolate the numerical differential between provided integers to generates projected values. The projected values occur in the indicated interval, thereby providing an actual parameter value to each individual instance in the array of instances.

In one embodiment, layout tool 102 also includes a "Skip Bits" configuration field. In one embodiment, the "Skip Bits" field allows user to define bit positions to be skipped over during placement of an array of instances with patterns defined by the ellipsis notation. For example, a common register is made up of an array of latches and one or more clock drivers, with the clock drivers placed in between the latches. By defining the clock driver positions as Skip Bit values, a user can specify the array of latches with fipBit values. As such, system 100 places the array of latches horizontally according to the fipBit values, skipping over the Skip Bits positions of the clock drivers.

In one embodiment, system 100 processes a multi-level schematic sequentially from the lowest level of the hierarchy to the highest level. In an alternate embodiment, system 100 processes a multi-level schematic from the highest level of the hierarchy to the lowest level.

FIG. 2 illustrates an example placed layout in accordance with the parameters and circuit elements described below. Generally, system 100 stacks all instances in the same fipBit position according to their relative fipylevel. In this example, all fipPcskip and fipRot parameters are "0" and "R0" respectively, the bit width is 4 um, and SkipBits is "4".

TABLE 1

INSTANCES:

Inst61<0:2>: fipBit: "0 2 . . . " fipYlevel: "3" fipSnap: on
Inst62<0:4>: fipBit: "0 1 . . . " fipYlevel: "5" fipSnap: on
Inst63<0:2>: fipBit: "0 2 . . . " fipYlevel: "0" fipSnap: off
Inst64<0:3>: fipBit: "<*1> 0 <*2> 2 <*1> 5" fipYlevel: "10" fipSnap: off
Inst65<0:1>: fipBit: "1 3" fipYlevel: "0" fipSnap: off As shown, Inst63<0> is in fipBit 0 and has the lowest fipylevel of Inst61<0>, Inst62<0>, Inst63<0>, and Inst64<0>. Therefore, system 100 places Inst63<0> at the lowest vertical position. Inst61<0> abuts to the top of Inst63<0>, as it has the next lowest fipylevel. In one embodiment, fipylevels do not have to be sequential, and only their relative magnitude in relation to other cells in their stack is important. Thus, for example, fipylevel 1 and 10 abut if there are no instances in levels 2-9.

In one embodiment, for multi-bit arrayed instances, such as Inst65<0 1>, for example, a fipBit value is required for each bit of the array. Thus, for example, if Inst65<0:1> has a fipBit equal to "2 4", system 100 places Inst65<0> at bit 2 and Inst65<1> at bit 4.

In one embodiment, system 100 places some arrayed instances using patterns, such as, for example, the appended ellipsis pattern described above. For example, absent the appended ellipsis pattern, placing Inst62<0:4> requires the fipBit string of "0 1 2 3 5." In one embodiment, the design engineer can represent this fipBit string as "0 1 . . . ".

Absent a SkipBit, the pattern extrapolates to "0 1 2 3 4." In this example, however, the last cell, Inst62<4>, is in bit position 5, as SkipBit is set to 4. In one embodiment, SkipBit forces any pattern extrapolation to skip the designated list of bit positions, in all fields. For example, Inst63<0:2> has an fipBit of "0 2 . . . ", which translates to "0 2 4." In one embodiment, the system assumes sequential placement where the placement of a multi-bit arrayed instance is a single numerical value; that is, "0" is the same as "0 1 . . . ".

Inst64<0:3> illustrates a more complex pattern notation. System 100 reads <*X>, where X is an integer, as an instruction to place the next X bits using the pattern immediately following the brackets. In the illustrated case of Inst64<0:3>, system 100 places the first bit using "0". The system places the next two bits using "2," which translates to "2 3 . . . ", and the final bit using "5". This makes the final placement for the array "0 2 3 5".

Inst61<0:2> illustrates operation of the snap mechanism, in one embodiment. As Inst61<0:2> has snap enabled, the tallest instance in the array, Inst61<0>, sets the snap line for fipylevel 3. As shown, in FIG. 2, the snap line is set at Y=9 microns, which is the sum of the height of Inst63<0> and Inst61<0>, from the origin (0,0) for fipylevel 3. As fipSnap is also on in Inst62<0:4>, it will conform to snapping rules and they system will place it no lower than the highest snap line below it. Inst62<0:4> is in fipylevel 5, so the highest snap line beneath it is the one created in fipylevel 3 by Inst61<0>. Therefore, the system snaps all instances in Inst62<0:4> to the snap line at Y=9 microns. As shown, this creates artificial gaps below Inst62<1:4> due to the location of the snap line and either a smaller or no instance for the fipylevel immediately "below" the snap line.

Figure 3:
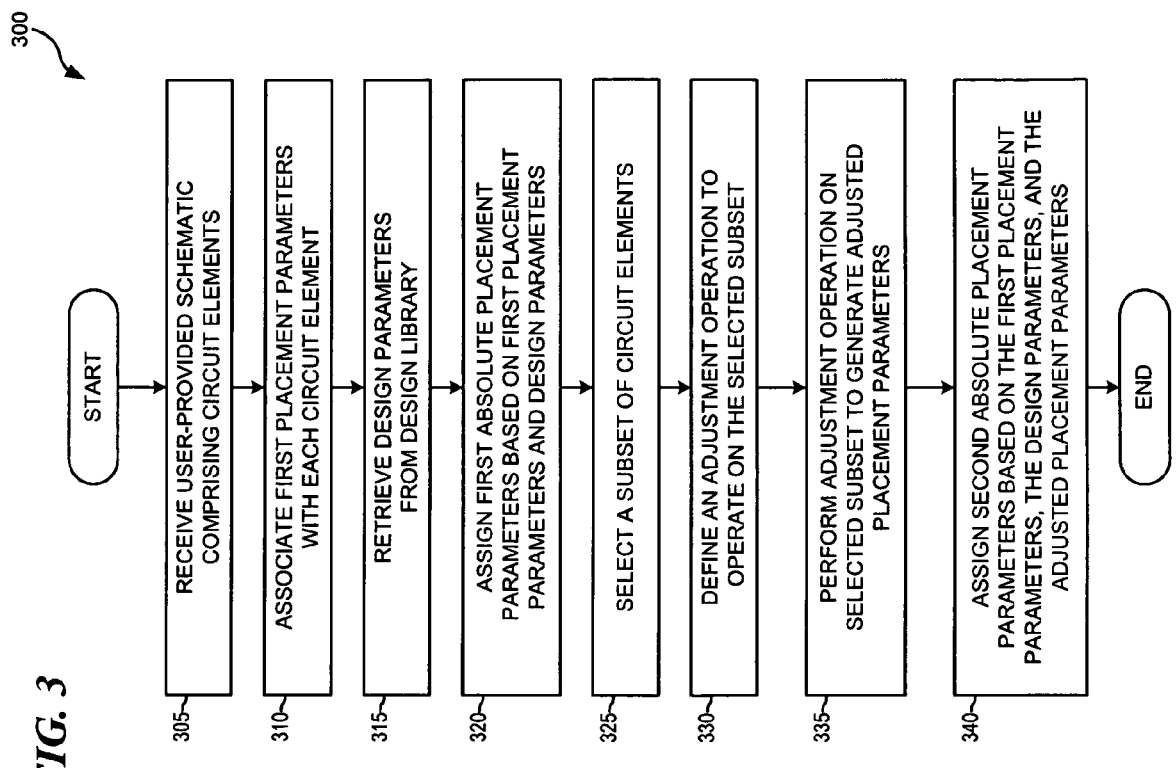
FIG. 3 illustrates a high-level flow diagram depicting logical operational steps of an improved custom circuit design placement method, which can be implemented in accordance with a preferred embodiment.

Thus, FIG. 2 illustrates the general principles of the system 100 in which the present invention operates. FIG. 3 described in more detail the operation of system 100, in accordance with one embodiment of the present invention.

FIG. 3 illustrates one embodiment of a method for improved custom circuit design placement method. Specifically, FIG. 3 illustrates a high-level flow chart 300 that depicts logical operational steps performed by, for example, system 100 of FIG. 1, which may be implemented in accordance with a preferred embodiment. Generally, layout tool 102 performs the steps of the method, unless indicated otherwise.

As indicated at block 305, the process begins, wherein system 100 receives a user-provided schematic comprising a plurality of circuit elements. For example, layout tool 102 receives a user-provided schematic 110 comprising circuit elements 112. Next, as illustrated at block 310, the system associates first placement parameters with each circuit element. For example, layout tool 102 receives placement parameters 132 from placement parameter module 130.

In one embodiment, received placement parameters comprise both default placement parameters and user-provided placement parameters. In one embodiment, default placement parameters comprise placeholder values that have the same effect on placement as missing parameters. For example, in one embodiment, placement parameters include an fipRot parameter, and a default fipRot parameter equals "0" (indicating no rotation).

Next, as indicated at block 315, system 100 retrieves design parameters from a design library. For example, layout tool 102 retrieves design parameters 122 from design library 120. Generally, as described above, the retrieved design parameters are associated with particular circuit elements. As such, with the retrieved design parameters and the first placement parameters, layout tool 102 can begin to place the specific circuit element instances.

Accordingly, as indicated at block 320, system 100 assigns first absolute placement parameters based on the first placement parameters and the design parameters. For example, as illustrated above in FIG. 2 and the accompanying disclosure, system 100 places individual circuit element instances according to their design parameters and first placement parameters.

Next, as indicated at block 325, system 100 selects a subset of circuit elements. In one embodiment, element selection module 134 selects the subset of circuit elements. In one embodiment, the subset of circuit elements is based on input received from a user. In one embodiment, system 100 selects a subset of circuit elements based on one or more of the design parameters and the first placement parameters.

For example, in one embodiment, system 100 processes a function (the "setEq") that defines the set of parameters representing the selected circuit elements (the "parmSet"). In one embodiment, setEq is an equation or function that operates on an initial set of identified parameters to generate a final parmSet of selected parameters. Thus, in one embodiment, setEq takes as input all of the circuit element cells in the user-provided schematic (or a user-provided subset of cells) and applies an algebraic operation to one or more design/placement parameters of the input cells. The algebraic operation identifies the parmSet by deselecting certain of the input cells, based on their placement parameters and/or design parameter.

For example, in one embodiment, the setEq is a unity operator, which simply selects the initial input set of circuit element cells. In this case, the unity operator setEq supports a manual group definition comprising a parmSet entirely defined by the user's manual definition of the group. In an alternate configuration, setEq is a dynamic algebraic operator, which performs a calculation on certain design/placement parameters of the input set of cells, deselecting certain cells based on the calculation results. For example, setEq can be configured to deselect "all cells of the user-provided schematic whose fipBit value is less than n" or "all cells whose area exceeds n."

Thus, as described above, system 100 selects a subset of circuit elements. Next, as indicated at block 330, system 100 defines an adjustment operation to operate on the selected subset. In one embodiment, adjustment operations module 136 defines the adjustment operation.

For example, in one embodiment, system 100 processes a function (the "parmEq") that operates on a set of parameters of the selected circuit elements, the parmSet. In one embodiment, parmEq is an equation or function mapped to the values in the parmSet, which adjusts the placement parameters, resulting in group or block movement. Thus, in one embodiment, parmEq takes as input some of the placement parameters of the selected circuit element cells and applies an algebraic operation to the input placement parameters.

For example, in one embodiment, parmEq performs a logical shifting operation. In one embodiment, a logical shifting operation moves a group of cells horizontally based on a set shift amount. As such, a logical shifting parmEq can support implementing area changes in either the layout or schematic across a group of cells.

In another embodiment, parmEq performs a logical scaling operation. In one embodiment, a logical scaling operation moves a group of cells vertically or by area, by varying amounts. As such, a logical scaling parmEq can support implementing area changes in either the layout or schematic across a group of cells.

In another embodiment, parmEq performs complex mapping operations. In one embodiment, complex mapping operations algorithmically analyze multivariable parameters from many sources to modify or replicate circuit elements. In one embodiment, complex mapping operations include block mirroring and schematic-to-layout mapping.

In one embodiment, block mirroring supports both horizontal and vertical re-ordering by mirroring the entire schematic or a subsection across the x-axis (or y-axis). Additionally, block mirroring also supports a mirror process that takes into account multiple parameters (such as congestion and neighbor placement), which can optimize subsection mirror operations.

In one embodiment, schematic-to-layout mapping supports generating appropriate placement parameter values based on the circuit element placement found in the user-provided schematic. That is, in one embodiment, system 100 reads the position of the cells as they are drawn in the schematic, and maps the cell schematic placements to the layout placement locations, updating the cell placement parameters to reflect the layout placement.

Schematic-to-layout mapping is particularly useful in bit stack or row design, where all the cells in the schematic share either the Y or X position. In these types of designs, design engineers very often place blocks in the schematic in a similar way to the layout placement. For example, in some designs, blocks on the bottom of the schematic occupy the bottom of the bit stack in the placed layout. Accordingly, with schematic-to-layout mapping, system 100 can map schematic positions into placement parameters.

Thus, as described above, system 100 defines an adjustment operation to perform on the selected subset. Next, as indicated at block 335, system 100 performs the adjustment operation on the selected subset, generating adjusted placement parameters. In one embodiment, adjustment operations module 136 executes the adjustment operation.

In one embodiment, the adjustment operation results in a change in values in one or more placement parameters (the "affected parameters"). In one embodiment, system 100 replaces the affected placement parameters' values with the adjusted placement parameter values. In an alternate embodiment, system 100 stores the adjusted placement parameter values with the original placement parameters. As such, the "adjusted placement parameters" are, in one embodiment, the affected placement parameters, and are, in another embodiment, the new placement parameters.

Next, as indicated at block 340, system 100 assigns second absolute placement parameters based on the first placement parameters, the design parameters, and the adjusted placement parameters and the process ends. In one embodiment, layout module 102 assigns the second absolute placement parameters. That is, in one embodiment, having adjusted the original (first) placement parameters, system 100 arranges the circuit elements from the user-provided schematic into a placed layout based on the adjusted placement parameters, which results in new absolute placement parameters.

In the illustrated embodiment, the process ends after a single iteration of adjusted placement parameters and absolute placement parameters. In an alternate embodiment, system 100 returns to block 325, selecting a subset of circuit elements in the user-provided schematic.

Thus, generally, system 100, operating as described in FIG. 3, can manipulate placement parameters across multiple circuit element instances. As such, this robust and flexible tool allows a user to employ the same tool and methodology across multiple custom VLSI designs. Further, the embodiments described herein allow for multiple cell movement that does not require tedious, one-at-a-time, individual selection and alteration of placement parameters.

Accordingly, the disclosed embodiments provide numerous advantages over other methods and systems. For example, the learning effort required by a design engineer to encode placement information into placement parameters is very small. Further, schematic driven placement is significantly faster than graphical, iterative manual placement of instances or writing unique functions to place instances in the layout for each design.

The disclosed embodiments also improve design revisions due to changes in technology. For example, the absolute values of the width of each physical bit position and the PC pitch depend upon the technology and the library cells that are used in the design. The layout tool generates these coordinates, which are thus dynamically adaptable to technology migration. The parameters of a given technology/methodology can be changed in the program in order to adapt to a new project environment. This enables migration of the schematic and placed layout designed from one technology to another technology, or from one cell library to another cell library, by updating the parameters within the placement routine and re-processing a layout with it.

Further, many library cells have fixed X dimensions and variable Y dimensions, with the Y level instance parameter configured as a relative position. As such, the disclosed embodiments can regenerate vertical Y dimension changes of an instance due, for example, to device re-sizing for performance tuning or logic changes for functional reasons. The disclosed embodiments therefore save time on otherwise time-consuming manual circuit element movement.

Additionally, the disclosed embodiments provide a layout with placed instances of circuits that better reflects the actual size and form factor of the final design. As such, the design engineer has access to more accurate area/form factor estimation of all the macro designs, earlier in the design phase. Providing more accurate design estimation earlier allows for more accurate floor planning in the next level of the chip design. Sizing and wiring constraints and conflicts are therefore more apparent and can be captured earlier in the design process.

Figure 4:
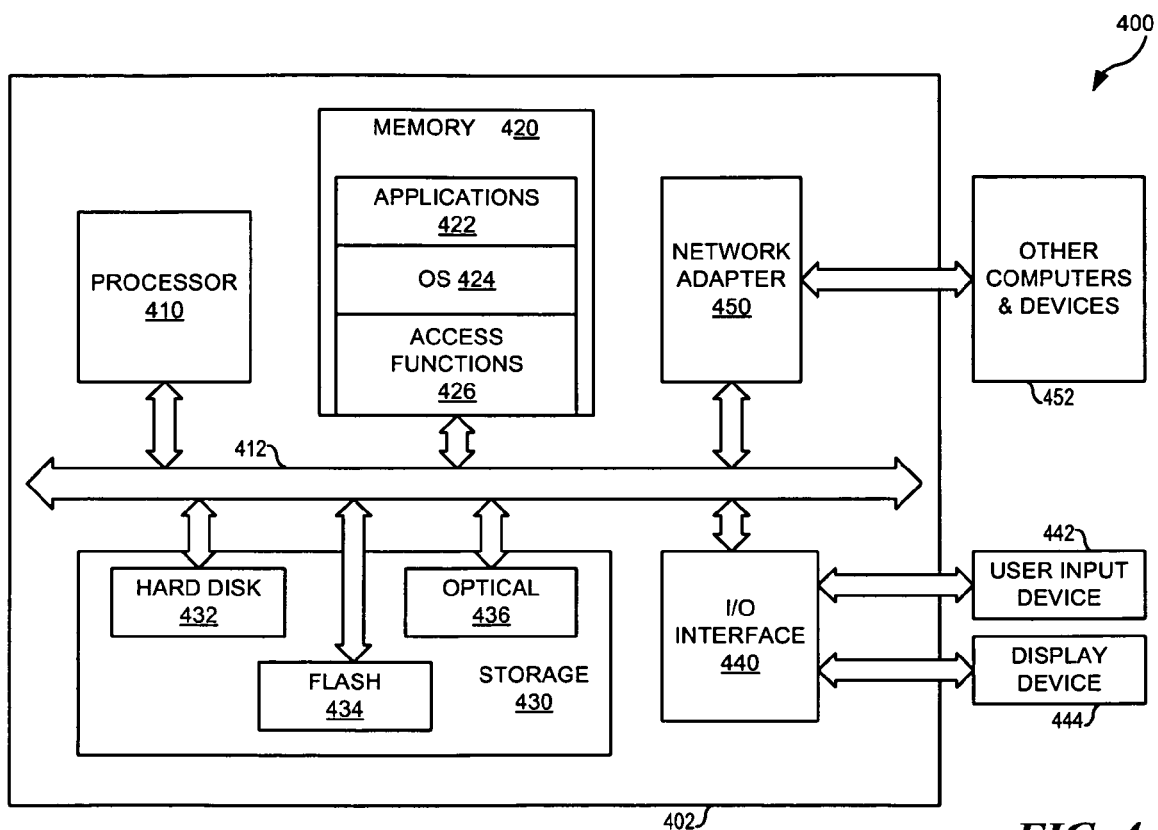
FIG. 4 illustrates an example computer system that can be configured in accordance with a preferred embodiment.

FIG. 4 is a block diagram providing details illustrating an exemplary computer system employable to practice one or more of the embodiments described herein. Specifically, FIG. 4 illustrates a computer system 400. Computer system 400 includes computer 402. Computer 402 is an otherwise conventional computer and includes at least one processor 410. Processor 410 is an otherwise conventional computer processor and can comprise a single-core, dual-core, central processing unit (PU), synergistic PU, attached PU, or other suitable processors.

Processor 410 couples to system bus 412. Bus 412 is an otherwise conventional system bus. As illustrated, the various components of computer 402 couple to bus 412. For example, computer 402 also includes memory 420, which couples to processor 410 through bus 412. Memory 420 is an otherwise conventional computer main memory, and can comprise, for example, random access memory (RAM). Generally, memory 420 stores applications 422, an operating system 424, and access functions 426.

Generally, applications 422 are otherwise conventional software program applications, and can comprise any number of typical programs, as well as computer programs incorporating one or more embodiments of the present invention. Operating system 424 is an otherwise conventional operating system, and can include, for example, Unix, AIX, Linux, Microsoft Windows™, MacOS™, and other suitable operating systems. Access functions 426 are otherwise conventional access functions, including networking functions, and can be include in operating system 424.

Computer 402 also includes storage 430. Generally, storage 430 is an otherwise conventional device and/or devices for storing data. As illustrated, storage 430 can comprise a hard disk 432, flash or other volatile memory 434, and/or optical storage devices 436. One skilled in the art will understand that other storage media can also be employed.

An I/O interface 440 also couples to bus 412. I/O interface 440 is an otherwise conventional interface. As illustrated, I/O interface 440 couples to devices external to computer 402. In particular, I/O interface 440 couples to user input device 442 and display device 444. Input device 442 is an otherwise conventional input device and can include, for example, mice, keyboards, numeric keypads, touch sensitive screens, microphones, webcams, and other suitable input devices. Display device 444 is an otherwise conventional display device and can include, for example, monitors, LCD displays, GUI screens, text screens, touch sensitive screens, Braille displays, and other suitable display devices.

A network adapter 450 also couples to bus 412. Network adapter 450 is an otherwise conventional network adapter, and can comprise, for example, a wireless, Ethernet, LAN, WAN, or other suitable adapter. As illustrated, network adapter 450 can couple computer 402 to other computers and devices 452. Other computers and devices 452 are otherwise conventional computers and devices typically employed in a networking environment. One skilled in the art will understand that there are many other networking configurations suitable for computer 402 and computer system 400.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A computer-implemented method for generating an electronic circuit layout with placed circuit elements, comprising:
   receiving a user provided schematic, the user provided schematic comprising a plurality of circuit elements, each circuit element comprising general parameters;
   associating a plurality of first placement parameters with each of the plurality of circuit elements;
   wherein the first placement parameters comprise a cell horizontal position, a cell vertical stacking position, and a cell vertical adjacent spacing;
   retrieving, from a design library, design parameters associated with at least one of the plurality of circuit elements;
   assigning first absolute placement coordinates for each of the plurality of circuit elements based on the first placement parameters and the design parameters;
   selecting a subset of circuit elements;
   defining an adjustment operation to operate on the placement parameters of the selected subset of circuit elements;
   performing the adjustment operation on the placement parameters of the selected subset of circuit elements to generate adjusted placement parameters;
   assigning second absolute placement coordinates for each of the plurality of circuit elements based on the first placement parameters, the design parameters, and the adjusted placement parameters; and
   generating an electronic circuit layout with placed circuit elements based on the second absolute placement coordinates.

2. The method of claim 1, wherein the placement parameters further comprise a cell orientation and a vertical multiple alignment.

3. The method of claim 1, further comprising extrapolating placement positions from a numeric pattern.

4. The method of claim 1, wherein selecting a subset of circuit elements comprises providing a filter equation.

5. The method of claim 1, wherein selecting a subset of circuit elements comprises defining a set of parameters from the general parameters, the first placement parameters, and the design parameters.

6. The method of claim 1, wherein selecting a subset of circuit elements comprises applying a filter equation to select from among a user-provided subset of the plurality of circuit elements.

7. The method of claim 1, wherein selecting a subset of circuit elements comprises receiving user-provided input designating a subset of circuit elements.

8. The method of claim 1, wherein the adjustment operation comprises an adjustment equation operating on one or more of the first placement parameters.

9. The method of claim 1, wherein the adjustment operation comprises one of a Logical Shifting Equation, a Logical Scaling Equation, and a Complex Mapping Equation.

10. The method of claim 1, further comprising storing at least one adjusted placement parameter with at least one of the plurality of circuit elements.

11. The system of claim 1, wherein the adjustment operation comprises an adjustment equation operating on one or more of the first placement parameters.

12. The system of claim 1, further comprising storing at least one adjusted placement parameter with at least one of the plurality of circuit elements.

13. A computer program product for generating an electronic circuit layout with placed circuit elements, the computer program product stored on a non-transitory computer usable medium having computer usable program code embodied therewith, the computer useable program code comprising:
   computer usable program code configured to receive a user provided schematic, the user provided schematic comprising a plurality of circuit elements, each circuit element comprising general parameters;
   computer usable program code configured to associate a plurality of first placement parameters with each of the plurality of circuit elements;
   wherein the first placement parameters comprise a cell horizontal position, a cell vertical stacking position, and a cell vertical adjacent spacing;
   computer usable program code configured to retrieve, from a design library, design parameters associated with at least one of the plurality of circuit elements;
   computer usable program code configured to assign first absolute placement coordinates for each of the plurality of circuit elements based on the first placement parameters and the design parameters;
   computer usable program code configured to select a subset of circuit elements;
   computer usable program code configured to define, based on user input, an adjustment operation to operate on the placement parameters of the selected subset of circuit elements;
   computer usable program code configured to perform the adjustment operation on the placement parameters of the selected subset of circuit elements to generate adjusted placement parameters;
   computer usable program code configured to assign second absolute placement coordinates for each of the plurality of circuit elements based on the first placement parameters, the design parameters, and the adjusted placement parameters; and
   computer usable program code configured to generate an electronic circuit layout with placed circuit elements based on the second absolute placement coordinates.

14. The computer program product of claim 13, wherein the placement parameters further comprise a cell orientation and a vertical multiple alignment.

15. The computer program product of claim 13, further comprising computer usable program code configured to extrapolate placement positions from a numeric pattern.

16. The computer program product of claim 13, wherein selecting a subset of circuit elements comprises providing a filter equation.

17. The computer program product of claim 13, wherein selecting a subset of circuit elements comprises defining a set of parameters from the general parameters, the first placement parameters, and the design parameters.

18. The computer program product of claim 13, wherein selecting a subset of circuit elements comprises applying a filter equation to select from among a user-provided subset of the plurality of circuit elements.

19. The computer program product of claim 13, wherein selecting a subset of circuit elements comprises receiving user-provided input designating a subset of circuit elements.

20. The computer program product of claim 13, wherein the adjustment operation comprises an adjustment equation operating on one or more of the first placement parameters.

21. The computer program product of claim 13, wherein the adjustment operation comprises one of a Logical Shifting Equation, a Logical Scaling Equation, and a Complex Mapping Equation.

22. The computer program product of claim 13, further comprising computer useable program code configured to store at least one adjusted placement parameter with at least one of the plurality of circuit elements.

23. A hardware system, comprising:
- a layout tool configured to receive a user provided schematic, the user provided schematic comprising a plurality of circuit elements, each circuit element comprising general parameters;
- a design library comprising a plurality of design parameters;
- a placement parameter module comprising a plurality of placement parameters, an element selection module, and an adjustment operations module;
- wherein the placement parameters comprise a cell horizontal position, a cell vertical stacking position, and a cell vertical adjacent spacing;
- wherein the layout tool is further configured to:
  - retrieve, from the design library, design parameters associated with at least one of the plurality of circuit elements;
  - associate a plurality of first placement parameters from the placement parameter module with each of the plurality of circuit elements;
  - assign first absolute placement coordinates for each of the plurality of circuit elements based on the first placement parameters and the design parameters;
  - select a subset of circuit elements;
  - define an adjustment operation to operate on the placement parameters of the selected subset of circuit elements;
  - perform the adjustment operation on the placement parameters of the selected subset of circuit elements to generate adjusted placement parameters;
  - assign second absolute placement coordinates for each of the plurality of circuit elements based on the first placement parameters, the design parameters, and the adjusted placement parameters; and
  - generate an electronic circuit layout with placed circuit elements based on the second absolute placement coordinates.

24. The system of claim 23, wherein selecting a subset of circuit elements comprises defining a set of parameters from the general parameters, the first placement parameters, and the design parameters.

25. The system of claim 23, wherein selecting a subset of circuit elements comprises applying a filter equation to select from among a user-provided subset of the plurality of circuit elements.

* * * * *